United States Patent
Huybers et al.

(10) Patent No.: US 11,594,433 B2
(45) Date of Patent: Feb. 28, 2023

(54) ELECTRONIC COMPONENT TRANSFER APPARATUS

(71) Applicant: NEXPERIA B.V., Nijmegen (NL)

(72) Inventors: Ralph Huybers, Nijmegen (NL); Johannes Hubertus Antonius Van De Rijdt, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/864,809

(22) Filed: May 1, 2020

(65) Prior Publication Data
US 2020/0350190 A1 Nov. 5, 2020

(30) Foreign Application Priority Data
May 3, 2019 (EP) .................................... 19172481

(51) Int. Cl.
*B65G 47/91* (2006.01)
*H01L 21/67* (2006.01)
*H01L 21/683* (2006.01)

(52) U.S. Cl.
CPC ........ *H01L 21/67144* (2013.01); *B65G 47/91* (2013.01); *H01L 21/6838* (2013.01)

(58) Field of Classification Search
USPC .................................................. 414/416.02
See application file for complete search history.

(56) References Cited

U.S. PATENT DOCUMENTS

| | | | | |
|---|---|---|---|---|
| 2,335,613 A | * | 11/1943 | Sayen | ..................... B65B 21/20 414/416.02 |
| 5,639,203 A | * | 6/1997 | Lee | ..................... H05K 13/0482 414/416.02 |
| 6,439,631 B1 | * | 8/2002 | Kress | .................. B65G 47/918 294/65 |

FOREIGN PATENT DOCUMENTS

| | | |
|---|---|---|
| EP | 1588402 A1 | 10/2005 |
| JP | S62273749 A | 11/1987 |
| JP | 2003007731 A | 1/2003 |
| WO | 2004/064124 A1 | 7/2004 |

OTHER PUBLICATIONS

Extended European Search Report for priority European application No. EP19172481.4, 8 pages, dated Oct. 15, 2019.

\* cited by examiner

*Primary Examiner* — Ronald P Jarrett
(74) *Attorney, Agent, or Firm* — Ruggiero, McAllister & McMahon LLC

(57) ABSTRACT

A transfer head for an electronic component transfer apparatus and a method therefor. The transfer head includes a first vacuum pipet laterally spaced from a second vacuum pipet with a first pitch therebetween. The first pitch is variable between a first pitch position and a second pitch position.

15 Claims, 10 Drawing Sheets

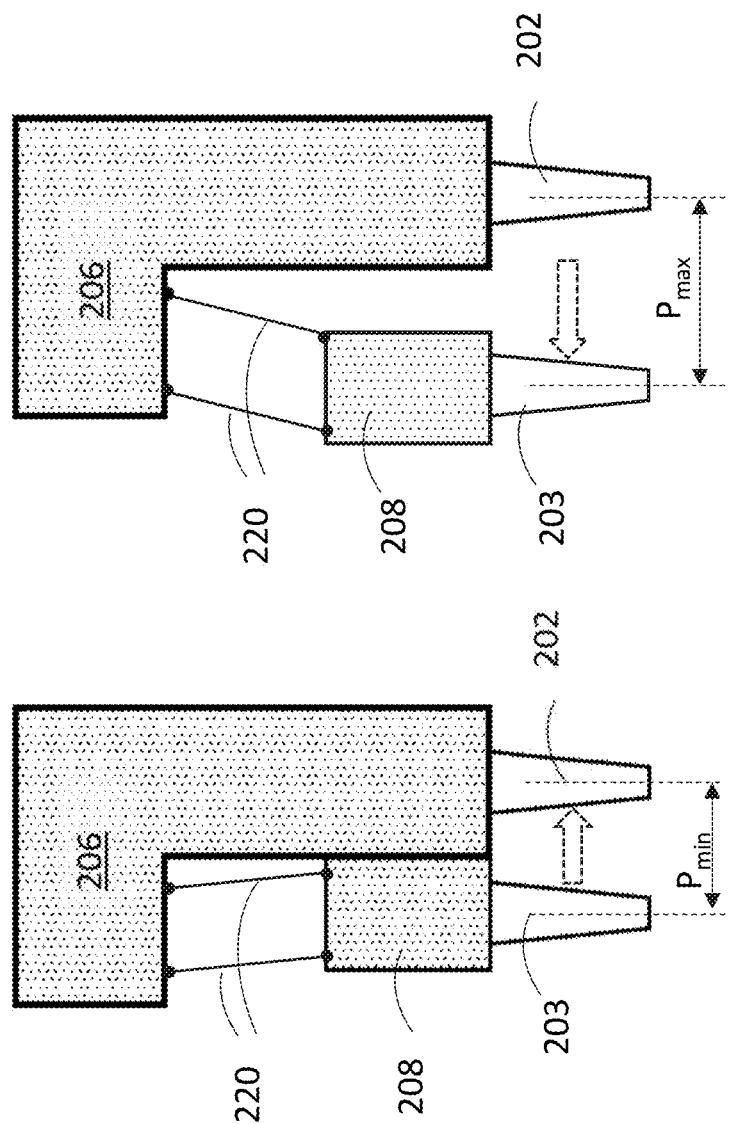

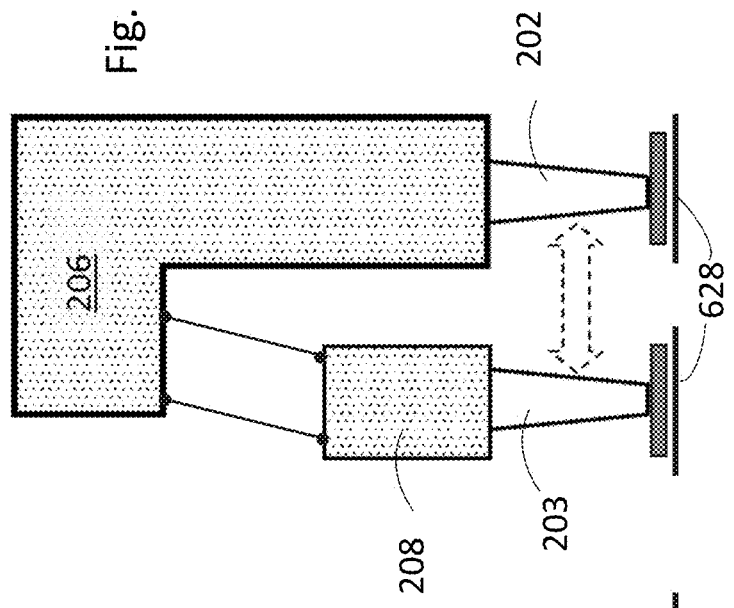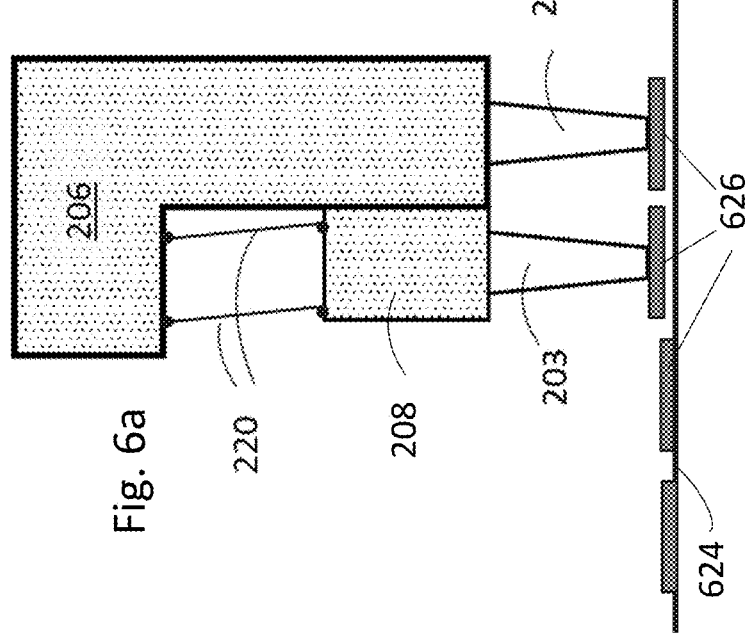

ELECTRONIC COMPONENT TRANSFER APPARATUS

CROSS REFERENCE TO RELATED APPLICATIONS

The present application claims foreign priority to European Patent Application No. 19172481 filed on May 3, 2019, the entirety of which is incorporated by reference hereby.

BACKGROUND OF THE DISCLOSURE

1. Field of the Disclosure

The present disclosure relates to a transfer head for an electronic component transfer apparatus. This disclosure also relates to an electronic component transfer apparatus and associated method of operation.

2. Description of Related Art

Electronic components such as semiconductor dies, also referred to as "chips", are typically manufactured by front-end epitaxial processes on a planar substrate known as a wafer, whereby the dies are arranged in a matrix on the substrate having a plurality of rows and columns of dies. After manufacture, a surface of wafer may typically be fixed to a carrier film or tape to support the individual dies following singulation of the dies. During singulation, the dies are physically separated from each other by a series of horizontal and vertical cuts through the wafer from one surface without cutting through the carrier film. In this way a matrix of individual semiconductor dies supported by the carrier film is obtained.

In known die handling processes, each die is mechanically picked up from the carrier film by moving the carrier film with respect to a mechanical pick-up. The mechanical pick-up is also known as a transfer head. The mechanical pick-up is then rotated and/or translated to allow the die to be placed at a target location such as a lead frame or other suitable substrate. This process is then repeated for each die on the carrier film until all of the dies on the carrier film are removed.

A known mechanical pick-up or transfer head 100, for an electronic component transfer apparatus is shown in FIG. 1. The known transfer head 100 comprises a vacuum pipet (also known as a collet) 102 for picking up the semiconductor die from the carrier film, holding the semiconductor die whilst the transfer head is moved to a target position, and releasing the semiconductor die from the collet 102 to a target location. The collet 102 comprises a pick-up opening 104 whereby a variable pressure generated at the opening 104. For example, a negative pressure at the pick-up opening 104 pulls the semiconductor die from the carrier film and holds the semiconductor die thereto (known as a "pick" operation).

The transfer head 100 is fixed to a transfer head housing 106, and the transfer head housing is fixedly attachable to a moveable member (not illustrated), such as a rotatable member. The transfer head is then moved, for example by rotation, to a target position, and the semiconductor die is released from the collet 102 and placed at a target position, such as a lead frame, by a positive pressure at the pick-up opening 104 (known as a "place" operation). Two or more transfer heads 100 may be radially spaced on a rotating member (not illustrated) or linearly spaced a translating member (not illustrated), such that when a first transfer head 100 is performing a pick operation, a second transfer head 100 is performing a place operation. Increasing the number of transfer heads 100 may increase the through-put (that is number of dies processed per hour) is limited. However, where optical inspection systems are used to monitor pick and place operations, the number of transfer heads 100 spaced on a rotating member is limited because a spacing is required between the transfer heads to allow a viewing window between the transfer heads.

Currently, the through-put is limited. The acceleration, speed of rotation or translation and deceleration of the transfer heads during the movement from the pick-up position to the target position are at or near maximum, taking into account current drive motors and the mechanical loads to be imposed on the various components. As a result, a further increase in the performance of the known transferring apparatus is difficult without improvements to the drive motors.

SUMMARY

Various example embodiments are directed to issues such as those addressed above and/or others which may become apparent from the following disclosure concerning increasing the throughput of semiconductor die handling systems.

In certain example embodiments, aspects of the present disclosure involve increasing the throughput of semiconductor die handling systems without increasing the speed of rotation and/or number of transfer heads.

According to an embodiment there is provided a transfer head for an electronic component transfer apparatus, the transfer head comprising: a first vacuum pipet laterally spaced from a second vacuum pipet with a first pitch therebetween; wherein the first pitch is variable between a first pitch position and a second pitch position.

The first vacuum pipet may be fixed; and the second vacuum pipet is moveable in a lateral direction with respect to the first vacuum pipet to vary the first pitch.

Optionally, a third vacuum pipet laterally spaced from the first vacuum pipet and the second vacuum pipet with a second pitch between the second vacuum pipet and the third vacuum pipet; wherein the second pitch is variable between a first pitch position and a second pitch position.

The third vacuum pipet may be moveable in a lateral direction with respect to the second vacuum pipet to vary the second pitch.

The third vacuum pipet may be moveable in a lateral direction with respect to the first vacuum pipet.

The first, second and third vacuum pipets may be mounted on respective first, second and third housings.

The transfer head according to embodiments may further comprise one or more pitch controllers, configured and arranged to vary the first pitch and/or the second pitch. The pitch controller may comprise a piston configured and arranged to move the second vacuum pipet with respect to the first vacuum pipet.

Optionally, the pitch controller may further comprise: a motor rotatably attached to an eccentrically rotatable cam, wherein the rotatable cam is configured and arranged to move the piston under the rotating action of the cam.

Optionally, the pitch controller may comprise a linear motor configured and arranged to move the piston. The linear motor may be a piezoelectric motor or a Lorentz motor.

There is also provided a method of transferring an electronic component from a source location to a target location the method comprising: providing a transfer head comprising: a first vacuum pipet laterally spaced from a second vacuum pipet with a first pitch therebetween; wherein the first pitch is variable between a first pitch position and a second pitch position; positioning the transfer head at a source location; adjusting the first pitch between the first vacuum pipet and second vacuum pipet to correspond to the pitch between first and second electronic components on the source location; picking the first and second electronic components from the source location; moving the transfer head to a target location; adjusting the first pitch between the first vacuum pipet and second vacuum pipet to correspond to the pitch between first and second positions at a target location; and placing the first and second electronic components at the target locations.

There is further provided an electronic component transfer apparatus of comprising a plurality of transfer heads according to embodiments. The plurality of transfer heads may be radially spaced on a rotating assembly.

DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 5a illustrates a first collet head located in first position with respect to a second collet head;

FIG. 5b illustrates a first collet head located in second position with respect to a second collet head;

FIG. 6a illustrates a pick operation whereby a first collet head is located in first position with respect to a second collet head;

FIG. 6b illustrates a place operation whereby a first collet head is located in second position with respect to a second collet head;

DETAILED DESCRIPTION

Figure 1:
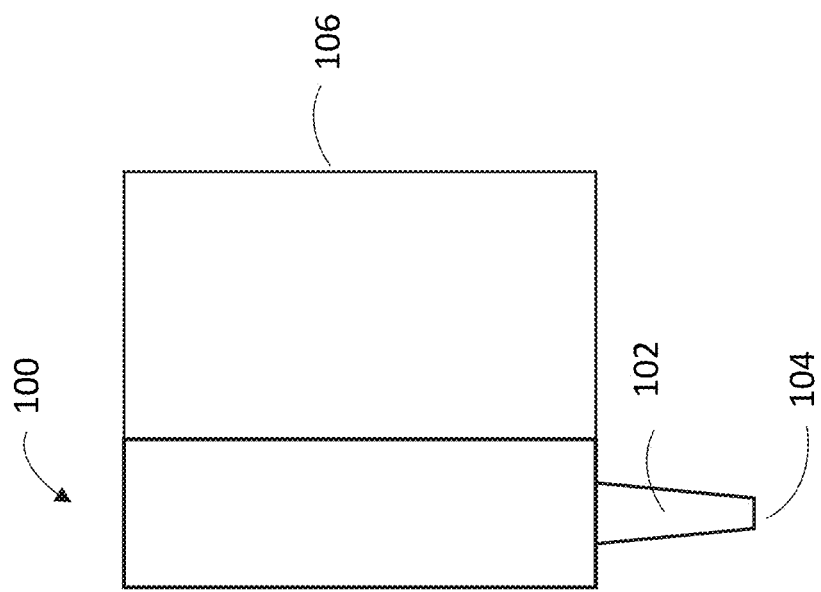
FIG. 1 shows a known transfer head for a semiconductor die transfer apparatus.
Figure 2A:
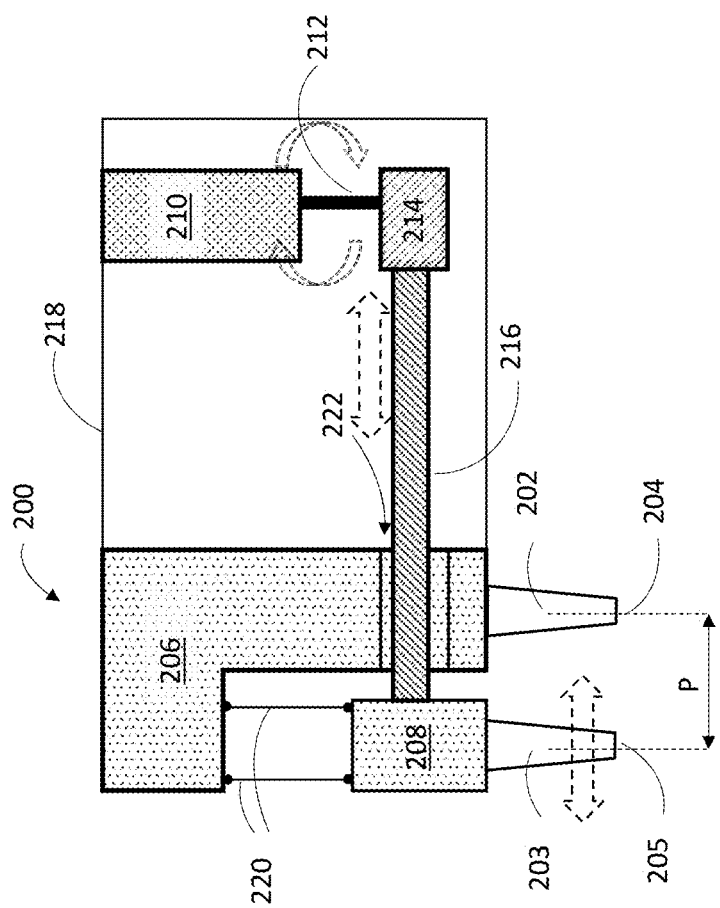
FIG. 2a illustrates a transfer head for a semiconductor die transfer apparatus according to an embodiment.

FIG. 2 illustrates a transfer head 200 for a semiconductor die transfer apparatus according to embodiments. The transfer head 200 comprises a first collet 202 and a second collet 203. The first and second collets 202, 203 (also known as vacuum pipets) comprise respective first and second openings 204, 205 formed at free ends thereof. The first collet 202 is mounted to a first collet housing 206 at an end thereof opposite the first collet free end. The second collet 203 is mounted to a second collet housing 208 at an end thereof opposite the second collet free end.

The pick-up opening 204 of the first collet 202 is spaced apart from the pick-up opening 205 of the second collet 203 by a pitch P. The second collet 203 is moveable with respect to the first collet 202. Likewise, the first collet housing 206 is fixed and the second collet housing 208 is spaced apart and moveable with respect to the first collet housing 206. In this way the pitch P, between the first and second pick-up openings 204, 205 is variable to any pitch between a first pitch position and a second pitch position. The first pitch position may be a minimum pitch and the second pitch position may be a maximum pitch.

The position of the second collet housing 208 is moveable with respect to the first collet housing by any suitable pitch control arrangement 218. For example, movement may be achieved by way of a motor 210 which is connected to and rotates a rotating shaft 212. The rotating shaft 212 may be connected to a cam 214, where the cam 214 acts on a translatable arm or piston 216 to move the piston horizontally under the rotating action of the cam 214. The horizontal movement of the piston 216 thus causes the second collet housing 208 to move with respect to the first collet housing 206. The second collet housing 208 is moveably connected to the first collet housing 206 by for example a leaf springs 220. The leaf springs 220 operate to guide the second collet housing 208 and as return mechanism to ensure that the second collet housing 208 is resiliently biased against the piston 216, thus ensuring contact between piston 216 and the second collet housing 208 at all times. This further ensures that control of the pitch P, between a maximum extent and a minimum extent, is based on movement of the piston 216 alone. Optionally, additional springs such as coil springs (not illustrated) may be included to provide an additional resilient return force on the second collet housing 208.

Figure 3B:
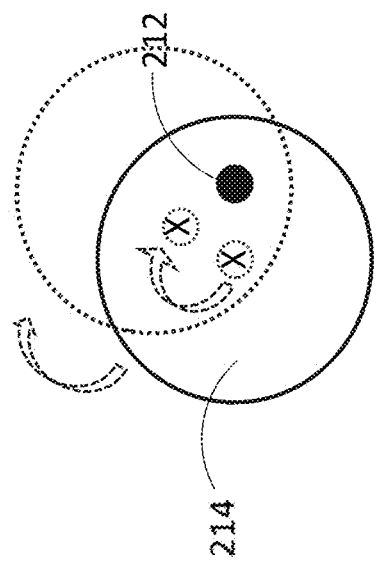
FIG. 3b illustrates a top down view of a cam, arrangement according to an embodiment, in a first position and a second position.
Figure 3A:
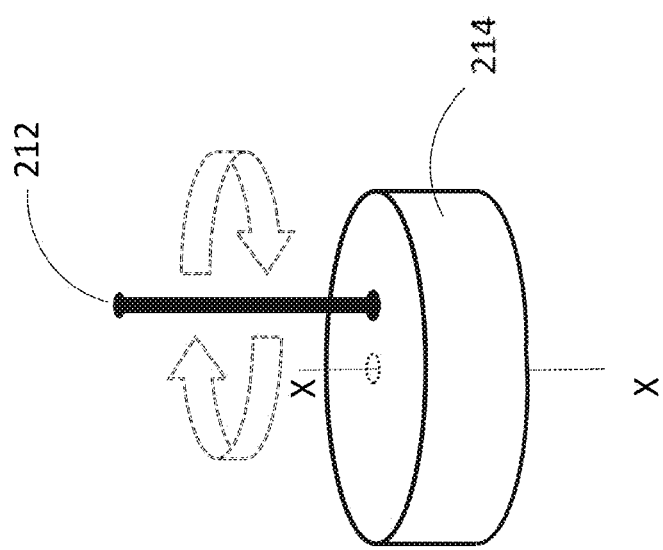
FIG. 3a illustrates a perspective view of a cam arrangement according to an embodiment.

Referring again to the rotating shaft 212, and the cam 214, the specific details of this arrangement are illustrated in FIGS. 3a and 3b. As illustrated, the rotating shaft 212 is connected to the cam 214 in an off-centre position, that is, the axis x-x illustrated in FIG. 3a is the notional central axis of rotation of the cam 214. However, given that the rotating shaft 212 is connected off centre, the cam 214 will rotate about the axis of the rotating shaft 212 and in this way the skilled person will see that the cam 214 rotates eccentrically about the axis of the rotating shaft 212 as illustrated in FIG. 3b. In other words, the centre of the rotating shaft 212 and that of the cam 214 are eccentric and not aligned.

Figure 4B:
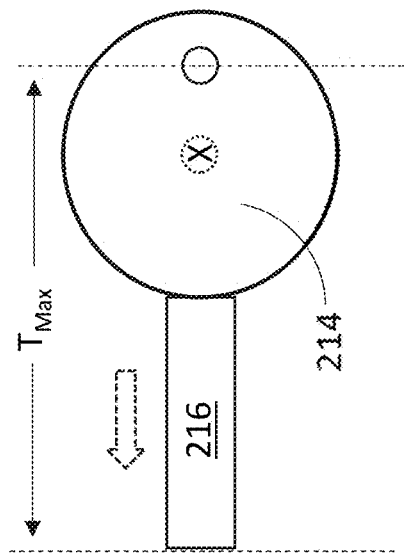
FIG. 4b illustrates a top down view of a cam, arrangement according to an embodiment, in a top dead centre position.
Figure 4A:
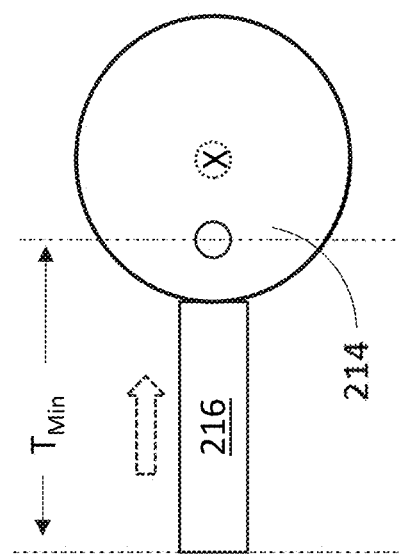
FIG. 4a illustrates a top down view of a cam, arrangement according to an embodiment, in a bottom dead centre position.

This eccentric alignment of rotating shaft 212 and the cam 214, allows for a reciprocating movement of the piston 216 between a minimum throw $T_{min}$ and maximum throw $T_{max}$, as illustrated in FIGS. 4a and 4b. In this case, the eccentric cam centre X can move in circular path around rotating shaft 212 as the motor 210 rotates the shaft. Therefore, as the cam 214 rotates eccentrically the piston 216 moves between an innermost position (known as bottom dead centre) as shown in FIG. 4a, and an outermost position (known as top dead centre) as shown in FIG. 4b.

Referring again to FIG. 2, and as described above, the reciprocating movement of the piston 216 acting on the second collet housing 208 moves the second collet 203 with respect to the first collet 202. The first collet housing 206 may optionally include a channel 222 formed therethrough to allow the piston 216 to contact and moveably contact the second collet housing 208.

FIGS. 5a and 5b illustrate the relative positions of the first collet 203 with respect to the second collet 202. For brevity and ease of understanding the piston 216 has been omitted. In FIG. 5a the first collet housing 208 is located at a position whereby the pitch P between the between the first and second pick-up openings 204, 205 is a minimum, $P_{min}$, which corresponds to the minimum throw $T_{min}$ of the piston 216 at the bottom dead centre position of FIG. 4a. In FIG. 5b the first collet housing 208 is located at a position whereby the pitch P between the between the first and second pick-up openings 204, 205 is a maximum, $P_{max}$, which corresponds to the maximum throw $T_{max}$ of the piston 216 at the top dead centre position of FIG. 4b.

Whilst the above discussion and figures shows that the pitch P between the first and second pick-up openings 204, 205 at a minimum, $P_{min}$, or a maximum $P_{max}$, the skilled person will appreciate that the pitch P may be any position intermediate the maximum pitch $P_{max}$ and minimum pitch $P_{min}$.

FIG. 6a and FIG. 6b illustrate pick and place operations respectively, of, for example semiconductor dies 626, using the transfer head 200 according to embodiments. As shown in FIG. 6a the pitch of the first and second collet openings 204, 205 is moved to a first position, corresponding to the bottom dead centre position as discussed above, using the control arrangement described above, to correspond the pitch of adjacent semiconductor dies 626 arranged on a carrier tape 624. The adjacent semiconductor dies 626 are picked up and removed from the carrier tape 624 by a vacuum (e.g. a negative pressure) at the first and second collet openings 204, 205.

As shown in FIG. 6b, the pitch of the first and second collet openings 204, 205 is moved to a second position, corresponding to the top dead centre position as discussed above, using the control arrangement described above, to correspond the pitch of target positions 628 of the semiconductor dies 626. The vacuum is then released (e.g. a positive pressure) from the first and second collet openings 204, 205 and the semiconductor dies are placed on the respective target positions 628. The target positions 628 may be lead frames for a semiconductor device, a packaging tape or other substrate such as a printed circuit board.

Whilst the above discussion illustrates that the collet pitch at the pick up position is less than the collet pitch at the place position, the skilled person that will appreciate that the collet pitch may be set any appropriate position between the maximum and minimum positions as required by the circumstances. For example, the pitch of the semiconductor dies at the pick up position may smaller than the pitch at the target position. Likewise, the pitch of the semiconductor dies at the pick up position may substantially equal to the pitch at the target position.

Figure 7A:
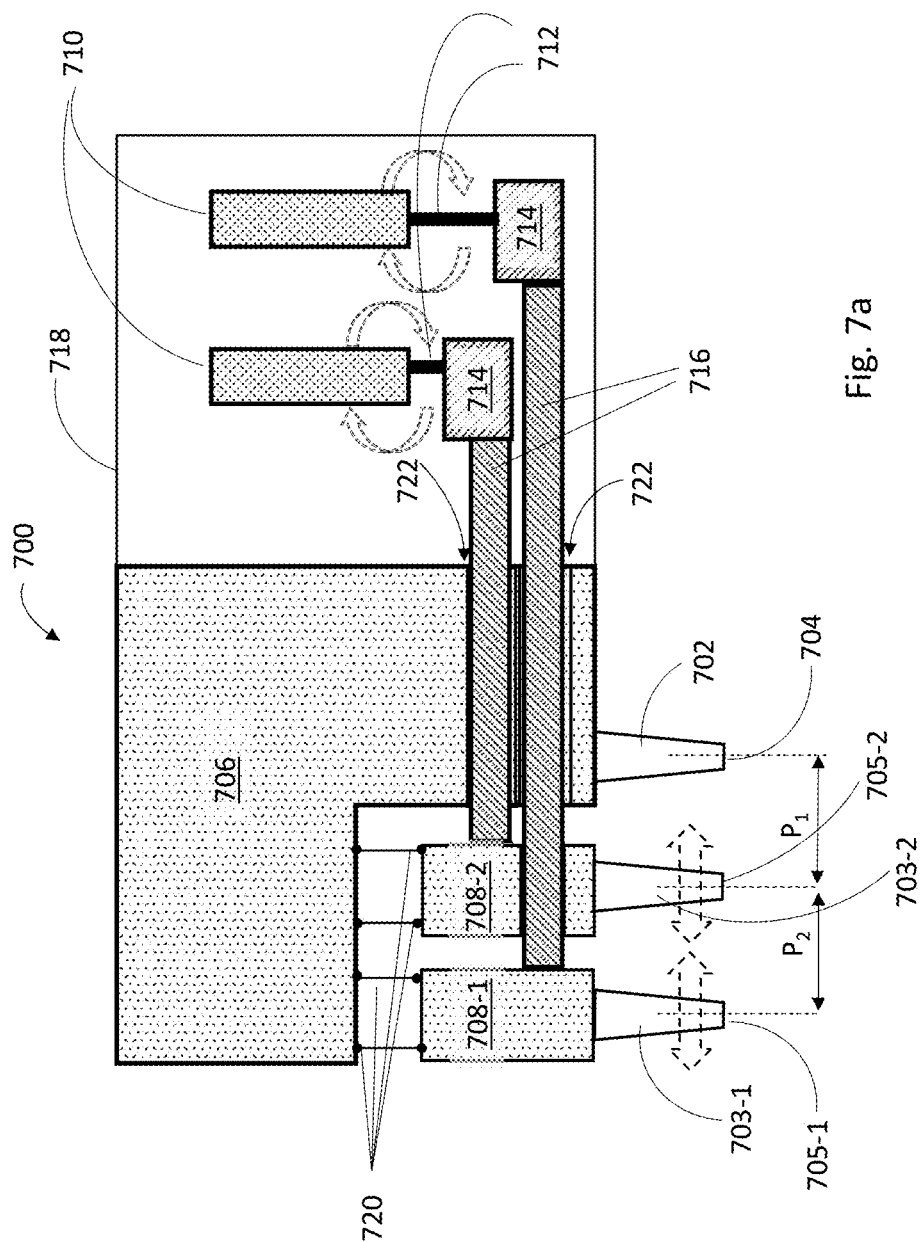
FIG. 7a illustrates a transfer head for a semiconductor die transfer apparatus according to an embodiment.

Whilst the above discussed transfer head 200 for a semiconductor die transfer apparatus relates two collets, one fixed and the other movable, the skilled person will appreciate that two or more moveable collets may be implemented based on the above teaching. FIG. 7 illustrates transfer head 700 for a semiconductor die transfer apparatus comprising two movable collet housings 708-1, 708-2 which are movable with respect to one another and movable with respect to a fixed collet housing 706. The transfer head 700 comprises a first collet 702, a second collet 703-1 and a third collet 703-2. The first, second and third collets 702, 703-1, 703-2 (also known a vacuum pipets) comprise respective first, second and third pick-up openings 704, 705-1, 705-2 formed at free ends thereof. The first collet 702 is fixed to a first collet housing 706 at an end thereof opposite the first collet free end. The second collet 703-1 is fixed to a second collet housing 708-1 at an end thereof opposite the second collet free end. The third collet 703-2 is fixed to a third collet housing 703-2 at an end thereof opposite the third collet free end.

The pick-up opening 704 of the first collet 702 is spaced apart from the pick-up opening 705-2 of the third collet 703-2 by a first pitch $P_1$. The third collet 703-2 is moveable with respect to the first collet 702. Likewise, the first collet housing 706 is fixed and the third collet housing 708-2 is spaced apart from and moveable with respect to the first collet housing 706. In this way the pitch $P_1$, between the first and third pick-up openings 704, 705-2 is variable between a maximum pitch position and a minimum pitch position. Furthermore, the pick-up opening 705-1 of the second collet is spaced apart from the pick-up opening 705-2 of the third collet 703-2 by a second pitch $P_2$. The third collet 703-2 and the second collet are moveable with respect to each other. In this way the second pitch $P_2$, between the second and third pick-up openings 705-1, 705-2 is variable between a maximum pitch position and a minimum pitch position.

The position of the second collet housing 708-1 is moveable with respect to the first collet housing 706 and the third collet housing 708-1 by any suitable control arrangement. Likewise, the third collet housing 708-2 is moveable with respect to the first collet housing 706 and the second collet housing 708-1 by any suitable control arrangement 718. The control arrangements for controlling the position of the second collet housing 708-1 and the third collet housing 708-2 may be similar to those mentioned above with respect to FIGS. 2, 3a, 3b, 4a and 4b. For example, the movement of the second and third collet housings 708-1, 708-2 may be achieved by way of respective motors 710 each of which may be connected to respective rotating shafts 712. The rotating shafts 712 may be connected to respective cams 714, where each cam 714 acts on a respective translatable arm or piston 716 to move the respective pistons 716 horizontally under the rotating action of the respective cam 714. The horizontal movement of the piston 716 thus causes the respective second or third collet housing 708-1, 708-2 to move with respect to each other and the first collet housing 706. The second and third collet housings 708-2, 708-1 are each moveably connected to the first collet housing 706 by for example leaf springs 720. The leaf springs 720 operate as discussed above with respect to FIG. 2, to ensure that the second collet housing 708-1 and the third collet housing 708-2 are each resiliently biased against their pistons 716, thus ensuring contact between respective pistons 716 and moveable collet housings 708-1, 708-2. This further ensures that control of the pitch P1-, and P2, between their maximum extent and minimum extent, are based on movements of the respective pistons 716 alone. Optionally, additional springs such as coil springs (not illustrated) may be included to provide an additional resilient return force on the second and third collet housings 708-2, 708-1.

The arrangement of the rotating shafts 712, cams 714 and pistons 716 follows the arrangement as described above with respect to FIGS. 3a, 3b, 4a and 4b. In the case of the arrangement of FIG. 7, the diameter of the each of the cams 714 may be equal or different. Where the diameters are equal the respective throws of the pistons 716 will be equal (assuming that the rotating shafts are identically located), however where the diameters are not equal the respective throws of the pistons 716 will be different.

The reciprocating movement of the pistons 716 acting on the respective second and third collet housings 708-1, 708-2 move the second and third collets 703-1, 703-2 with respect to each other and with respect to the first collet 702. As with the arrangement of FIG. 2, the first collet housing 706 may optionally include a channel 722 formed therethrough. Likewise, the third collet housing may optionally include a corresponding channel 722 formed therethrough. The channels 722 formed in first collet housing 706 and the third collet housing 708-2 may each be configured and arranged to allow the respective pistons 716 to contact and moveably contact the respective second and third collet housings 708-1, 708-2.

Figure 2B:
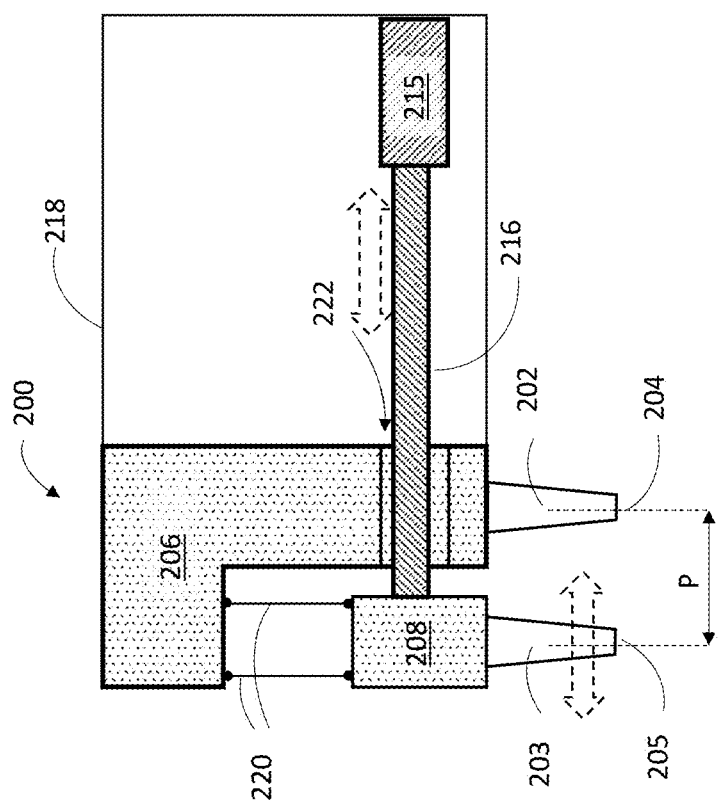
FIG. 2b illustrates a transfer head for a semiconductor die transfer apparatus according to an embodiment.
Figure 7B:
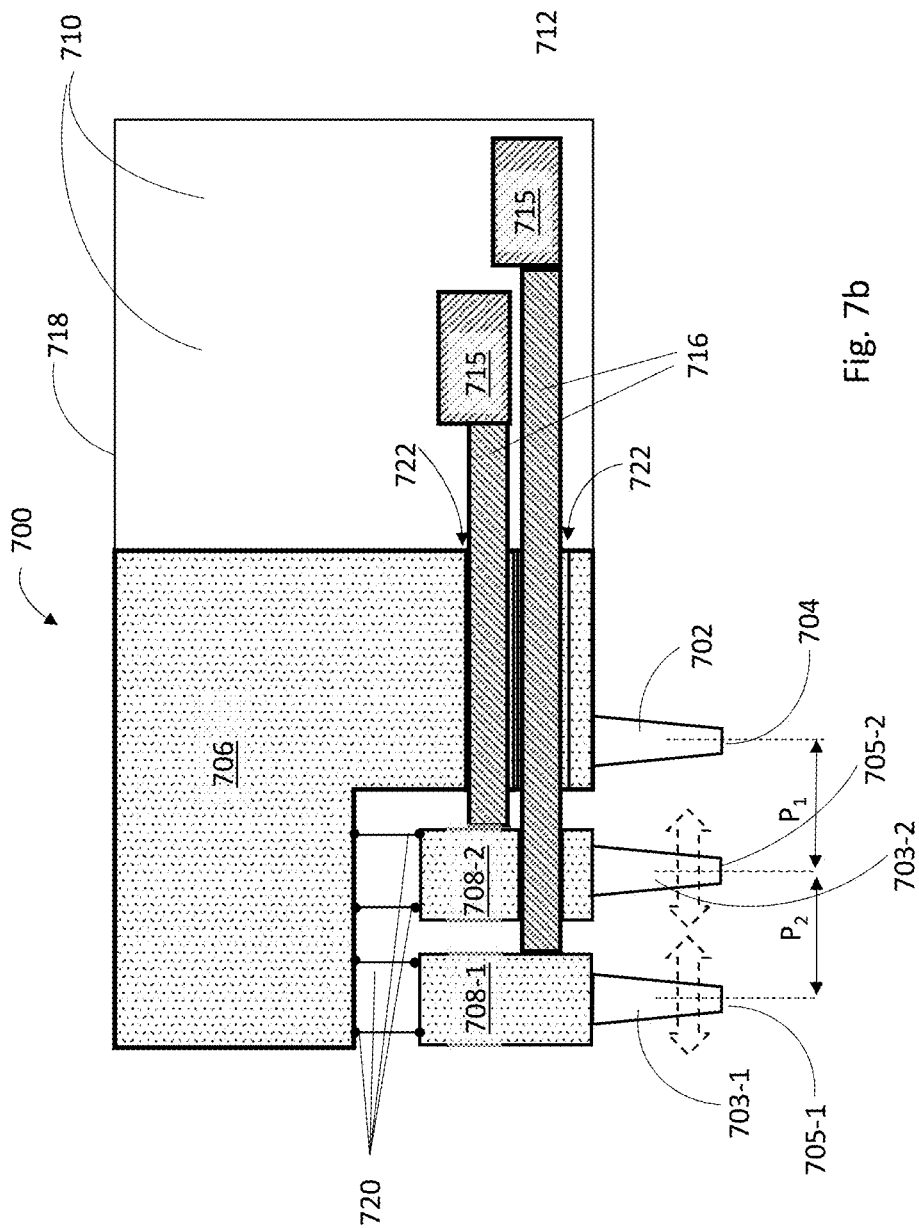
FIG. 7b illustrates a transfer head for a semiconductor die transfer apparatus according to an embodiment.

Whilst the above discussion relates to the use of motors 210, 710, rotating shafts 212, 712 and cams 214, 714, the skilled person will understand that they may be replaced by any appropriate any suitable control arrangement. For example, as shown in FIG. 2b and FIG. 7b, the translatable arms or pistons 216, 716 may form part of, or be driven by a linear motor 215, 715 such as a piezoelectric motor or Lorentz motor.

Figure 8:
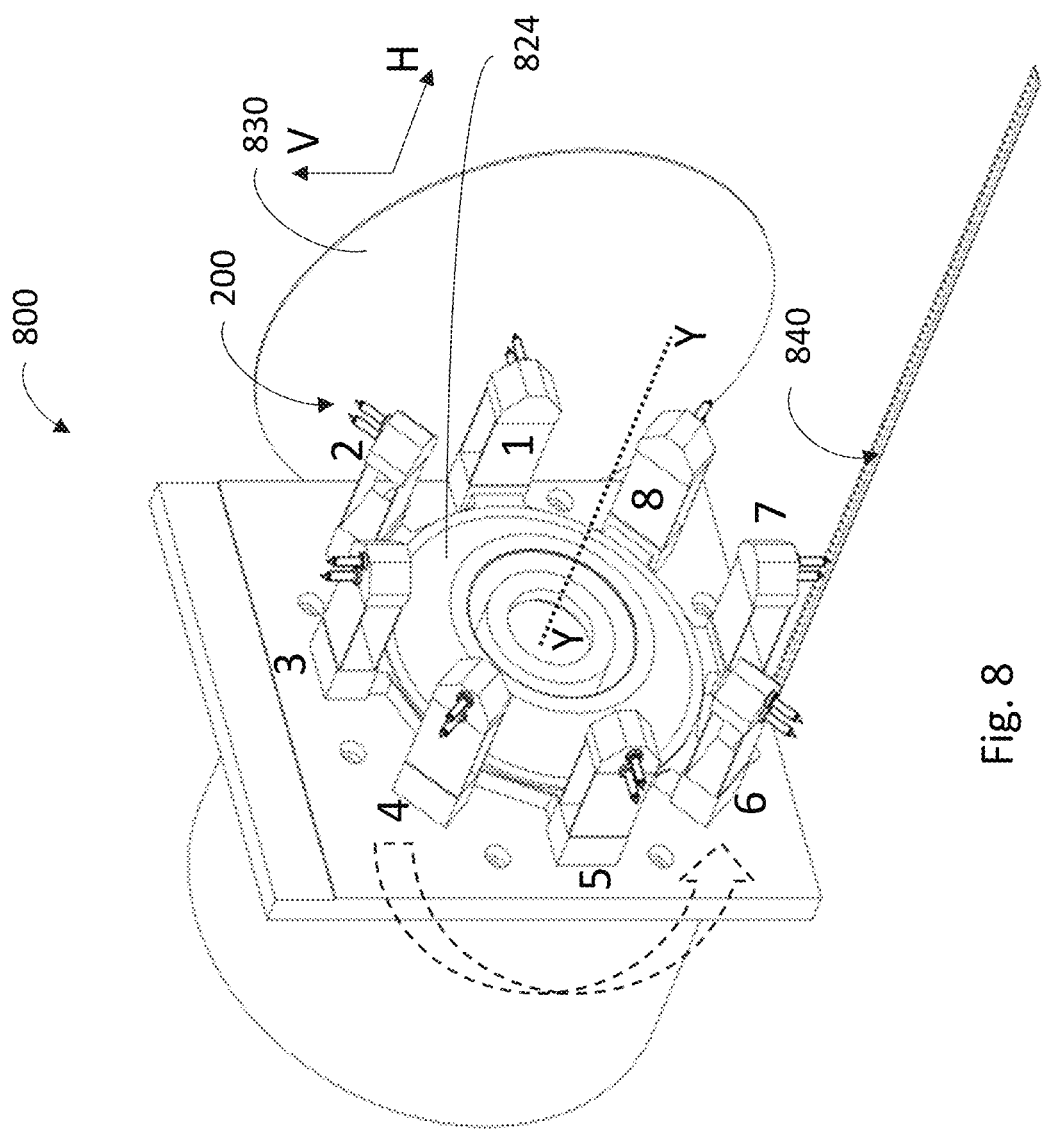
FIG. 8 illustrates a transfer apparatus comprising a plurality of transfer heads according to embodiments.

The skilled person will appreciate that one or more transfer heads 200, 700 according to embodiments may form part of an electronic component transfer apparatus. FIG. 8 illustrates a chip transfer apparatus 800 comprising a transfer head 200 as described above. Whilst the electronic component transfer apparatus 800 of FIG. 8 illustrates a plurality of transfer heads comprising two collets according to FIG. 2, the skilled person will appreciate that the transfer head may comprise two or more collets, such as the type described above with respect to FIG. 7. The pitch control as described above allows for different pitches at a source location (i.e. a pick position) and different pitches at the target location (i.e. place position).

The electronic component transfer apparatus of FIG. 8 comprises a plurality of, in this case eight, transfer heads 200 mounted to a rotatable transfer assembly 824. The rotatable transfer assembly 824 is adapted to rotate about the axis Y-Y. To aid understanding the positions of the transfer heads have been numbered 1 to 8. The electronic component transfer apparatus is arranged to pick, for example, semiconductor dies or other electronic component (not illustrated) from a matrix 830 of such semiconductor dies arranged on a carrier film, and place the semiconductor dies at a target location 840, such as a lead frame or a carrier tape. In this respect the matrix 830 may be considered a source location.

The transfer head located at position 1 picks semiconductor dies from the carrier film. The rotatable transfer assembly 824 is rotated in a step-wise manner in either a clockwise or anticlockwise direction such that the transfer head holding the semiconductor dies is rotated to position through positions 2 to 6 to position 7. At position 7 the transfer head transfers the semiconductor dies to the target location 840. As the transfer head holding the semiconductor dies is moved from position 1, the next transfer head is moved sequentially to position 1 and the next pick up operation is completed and this transfer head is moved through positions 2 to 6 to position 7 where the place operation is completed.

In this way the skilled person will see that the only position where no semiconductor dies are held by the transfer head is at position 8.

Whilst not illustrated, the skilled person will appreciate that optical inspection systems may be placed at various positions. For example, a semiconductor die inspection system may be arranged to view the picked dies at position 3. In addition, a further inspection system may be positioned to inspect s place operation to ensure that the semiconductor dies have been correctly placed at the target location 830. Also, whilst not illustrated semiconductor dies on the carrier film may fixed to an indexer allowing the carrier film to be moved or indexed vertically V and/or horizontally H (as shown in FIG. 8) to allow adjacent semiconductor dies to be removed from the carrier film.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A transfer head for an electronic component transfer apparatus, the transfer head comprising:
   a first vacuum pipet mounted on a first collet housing that is laterally spaced from a second vacuum pipet mounted on a second collet housing with a first pitch therebetween, the first pitch being variable between a first pitch position of the first vacuum pipet and a second pitch position of the second vacuum pipet,
   the first collet housing being fixed to a fixed position, and the second collet housing connected to at least one pitch controller configured to independently move the second collet housing in a lateral direction with respect to fixed position of the first collet housing to vary the first pitch between the first vacuum pipet and second vacuum pipet.

2. The transfer head of claim 1, further comprising:
   a third vacuum pipet laterally spaced from the first vacuum pipet and the second vacuum pipet with a second pitch between the second vacuum pipet and the third vacuum pipet; wherein the second pitch is variable between a first pitch position and a second pitch position.

3. The transfer head of claim 2, wherein the third vacuum pipet is moveable in a lateral direction with respect to the second vacuum pipet to vary the second pitch.

4. The transfer head of claim 2, wherein the third vacuum pipet is moveable in a lateral direction with respect to the first vacuum pipet.

5. The transfer head of claim 2, wherein the third vacuum pipet is mounted on a third collet housings.

6. The transfer head of claim 1 further comprising: the at least one pitch controller comprising a motor and configured and arranged to vary the first pitch.

7. The transfer head of claim 6, wherein the at least one pitch controller comprises a piston configured and arranged to move the second vacuum pipet with respect to the first vacuum pipet.

8. The transfer head of claim 7, wherein the at least one pitch controller further comprises: the motor rotatably attached to an eccentrically rotatable cam, wherein the rotatable cam is configured and arranged to move the piston under the rotating action of the cam.

9. The transfer head of claim 7, wherein the motor comprises a linear motor configured and arranged to move the piston.

10. The transfer head of claim 9, wherein the linear motor is a piezoelectric motor or a Lorentz motor.

11. A method of transferring an electronic component comprising:
providing a transfer head comprising: a first vacuum pipet mounted on a first collet housing that is laterally spaced from a second vacuum pipet mounted on a second collet housing with a first pitch therebetween, wherein the first pitch is variable between a first pitch position of the first vacuum pipet and a second pitch position of the second vacuum pipet, the first collet housing being fixed at a fixed position, and the second collet housing connected to at least one pitch controller configured to independently move the second collet housing in a lateral direction with respect to the fixed position of the first collet housing to vary the first pitch between the first vacuum pipet and second vacuum pipet;
positioning the transfer head at a source location;
adjusting the first pitch between the first vacuum pipet and second vacuum pipet to correspond to the pitch between first and second electronic components on the source location;
picking the first and second electronic components from the source location;
moving the transfer head to a target location;
adjusting the first pitch between the first vacuum pipet and second vacuum pipet to correspond to the pitch between first and second positions at a target location; and
placing the first and second electronic components at the target locations.

12. An electronic component transfer apparatus of comprising a plurality of transfer heads according to claim 1.

13. The electronic component transfer apparatus of claim 12, wherein the plurality of transfer heads are radially spaced on a rotating assembly.

14. The transfer head of claim 1, wherein the first collet housing comprises a channel formed therethrough configured and arranged to allow the pitch controller to moveably contact second collet housing.

15. The transfer head of claim 7, wherein the first collet housing comprises a channel formed therethrough configured and arranged to allow the piston to moveably contact second collet housing.

* * * * *